US008439615B2

(12) United States Patent
Wu et al.

(10) Patent No.: US 8,439,615 B2
(45) Date of Patent: May 14, 2013

(54) ASSEMBLY FOR MOUNTING ELECTRONIC COMPONENTS, METHODS OF USE AND MANUFACTURE THEREOF

(75) Inventors: Chi H. Wu, Quincy, MA (US); Liu C. Lei, ZhaBei Dist. (CN); Thomas J. Socci, Fairport, NY (US); Douglas Nobbs, Dover, NH (US); George R. Watchko, Stoneham, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 719 days.

(21) Appl. No.: 11/828,467

(22) Filed: Jul. 26, 2007

(65) Prior Publication Data

US 2008/0025813 A1 Jan. 31, 2008

Related U.S. Application Data

(60) Provisional application No. 60/820,619, filed on Jul. 28, 2006.

(51) Int. Cl.
 *F16B 35/04* (2006.01)
(52) U.S. Cl.
 USPC .......................................... 411/107; 411/999
(58) Field of Classification Search .................. 411/107, 411/353, 999
 See application file for complete search history.

(56) References Cited

U.S. PATENT DOCUMENTS

| | | | | | |
|---|---|---|---|---|---|
| 1,719,301 | A | * | 7/1929 | Metcalf, Jr. | 411/378 |
| 3,018,127 | A | * | 1/1962 | Dobrosielski et al. | 292/251 |
| 4,355,198 | A | * | 10/1982 | Gartland, Jr. | 174/66 |
| 4,474,676 | A | * | 10/1984 | Ishino et al. | 252/62.54 |
| 4,528,213 | A | * | 7/1985 | Nelson et al. | 427/105 |
| 4,542,372 | A | * | 9/1985 | Takach, Jr. | 340/500 |
| 4,934,953 | A | * | 6/1990 | Tenham et al. | 439/417 |
| 5,290,132 | A | * | 3/1994 | Gnage et al. | 411/512 |
| 5,316,165 | A | * | 5/1994 | Moran, Jr. | 220/62 |
| 5,388,940 | A | * | 2/1995 | Herren | 411/107 |
| 5,524,330 | A | * | 6/1996 | Alberini | 29/437 |
| 5,839,868 | A | * | 11/1998 | Kloian | 411/533 |
| 5,958,303 | A | * | 9/1999 | Narkis et al. | 252/511 |
| 6,028,769 | A | * | 2/2000 | Zurek | 361/704 |
| 6,248,262 | B1 | * | 6/2001 | Kubotera et al. | 252/511 |
| 6,281,433 | B1 | * | 8/2001 | Decker et al. | 174/394 |
| 6,623,226 | B2 | * | 9/2003 | Braun et al. | 411/353 |
| 6,926,537 | B1 | * | 8/2005 | Auchincloss et al. | 439/67 |
| 6,955,512 | B2 | * | 10/2005 | Allen et al. | 411/353 |
| 6,963,495 | B1 | * | 11/2005 | Carullo et al. | 361/818 |

\* cited by examiner

*Primary Examiner* — Flemming Saether
(74) *Attorney, Agent, or Firm* — Novak Druce Connolly Bove + Quigg LLP

(57) ABSTRACT

An assembly for mounting electronic components includes a face plate comprising a thermoplastic material. The face plate includes a retaining element for securing a captive screw and spring assembly for mounting an electronic printed circuit board. The retaining element includes one or more slots adapted to expand the element to permit insertion of the screw and deformation of the hole upon insertion of the screw, while locking the screw to retain the screw in place. This arrangement permits the elimination of the metal standoff frequently used in similar devices. Methods for preparing the assembly and mounting the printed circuit boards are also described.

8 Claims, 6 Drawing Sheets

ASSEMBLY FOR MOUNTING ELECTRONIC COMPONENTS, METHODS OF USE AND MANUFACTURE THEREOF

BACKGROUND OF THE INVENTION

The present invention generally relates to assemblies used for mounting electronic components onto the rack of an electronic device.

In various electronic components, especially in telecommunication equipment, electrically conductive systems are intended to provide shielding against electromagnetic interference (EMI). Face plates are typically used in rack-mounted telecommunication equipment for EMI shielding as described above.

Conventionally, face plates have been made primarily from metallic plates, and have printed circuit boards (PCBs) mounted onto their interior surface using screws. Face plates also have attachment hardware such as latches and captive screws that are used to mount the faceplate-PCB assembly to a rack. The screws, generally located at the top and bottom of the assembly, are captive and often have a spring to facilitate assembly and disassembly. Due to the limitations of the metal face plate manufacturing technology, the captive screws have to be supplied with a standoff to provide an apparatus and method of attachment for the screw-spring assembly to the faceplate. The standoff is press-fit into a hole drilled in the metal faceplate and retained on the faceplate.

While these conventional technologies work, the complexity of manufacture is generally high. Further, the use of multiple parts required makes it inconvenient and complicated to use for actual mounting. The above inconveniences further increase both the cost of manufacturing as well as the cost of using such assemblies.

Accordingly, there exists a need for an improved assembly system for mounting a face plate to a rack that overcomes the above mentioned limitations of conventional methods and assemblies.

SUMMARY OF THE INVENTION

According to certain aspects of the invention, an assembly for mounting electronic components comprises a face plate comprising a thermoplastic material. The faceplate includes a molded retaining element adapted to secure a captive screw and spring assembly in place. The screw and spring assembly is used to mount printed circuit boards onto the face place. The retaining element includes at least one or more slots which expand upon insertion of the threaded portion of the screw, and to contract to lock the shank portion of the screw in place when the threaded portion has passed through the hole.

In other aspects of the invention, the retaining element is cylindrical in shape and includes between one and eight slots, preferably four slots. The faceplate is preferably fabricated from a thermoplastic material which is either substantially electrically conductive, or is substantially electrically non-conductive with an electrically conductive conformal coating layer. The face plate can be advantageously manufactured by injection molding techniques.

BRIEF DESCRIPTION OF THE DRAWINGS

The foregoing and other advantages and features of the invention will become apparent upon reading the following detailed description and upon reference to the drawings in which.

DETAILED DESCRIPTION OF THE INVENTION

As used herein, the term "a" refers to "at least one", unless otherwise mentioned.

The terms "approximately the same" or "approximately equal" refer to nearly the same size with respect to the tolerance for interface, the free relative movement of parts, and the like.

FIGS. 1 to 6 illustrate an assembly for mounting electronic components onto a rack, the captive screws used therein, and the mode of use, according to various embodiments of the present invention.

Figure 1:
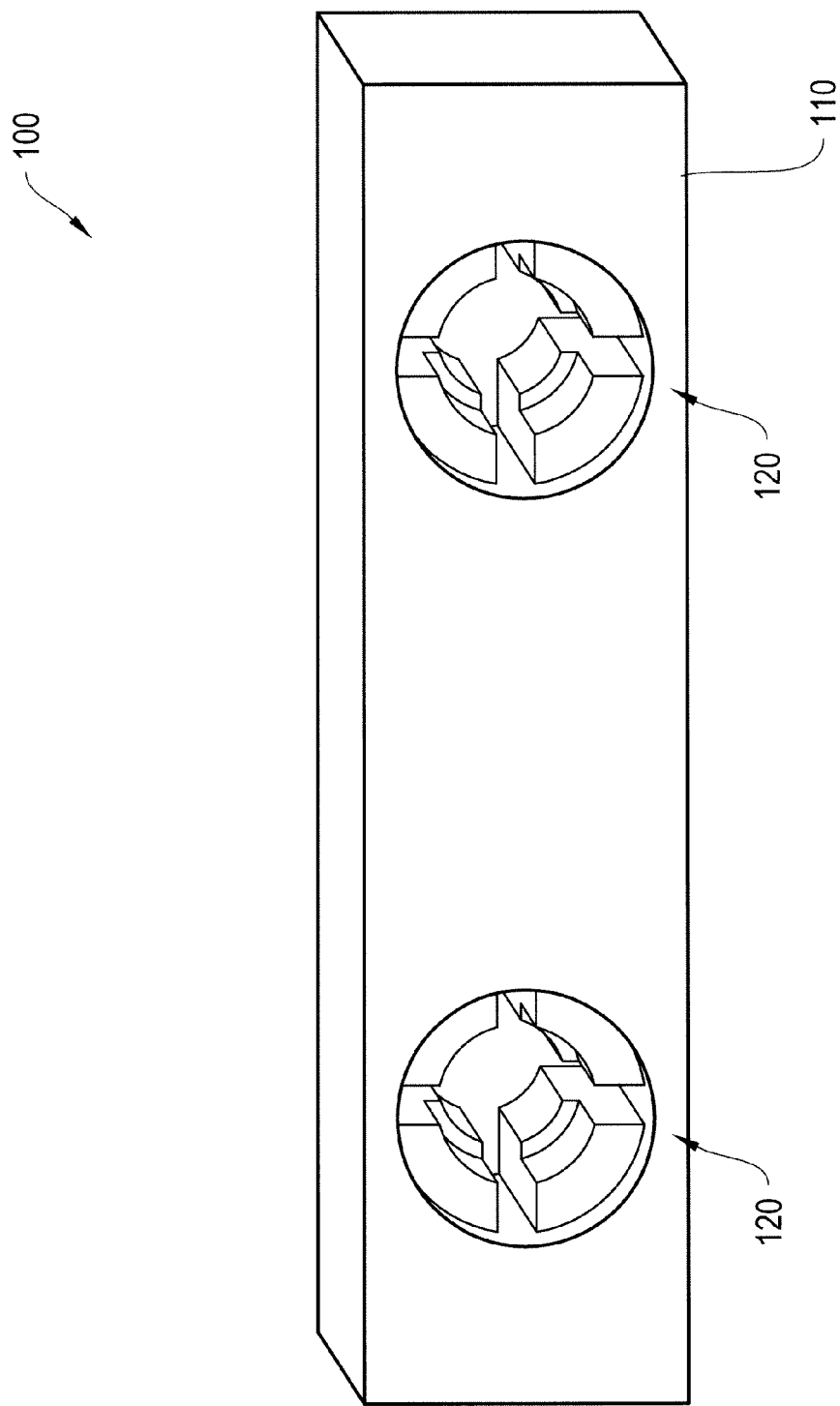
FIG. 1 is a perspective view of an assembly according to an aspect of the invention.

As illustrated in FIG. 1, an assembly 100 includes a faceplate 110 comprising a thermoplastic material. In the illustrated embodiments, the thermoplastic material is an electrically conductive thermoplastic material. In other embodiments, the faceplate may comprise a non-conductive thermoplastic that receives a secondary electrically conductive conformal coating. Such coatings may be applied using various coating processes including, for example, plating, painting, and thermal spraying among others. While the embodiments described herein have been discussed with respect to certain electrically conductive thermoplastics, those skilled in the art will readily appreciate the application of these embodiments to non-conductive thermoplastics having conductive coatings, and all such embodiments are included within the scope of the invention and captured in the claims.

Figure 2:
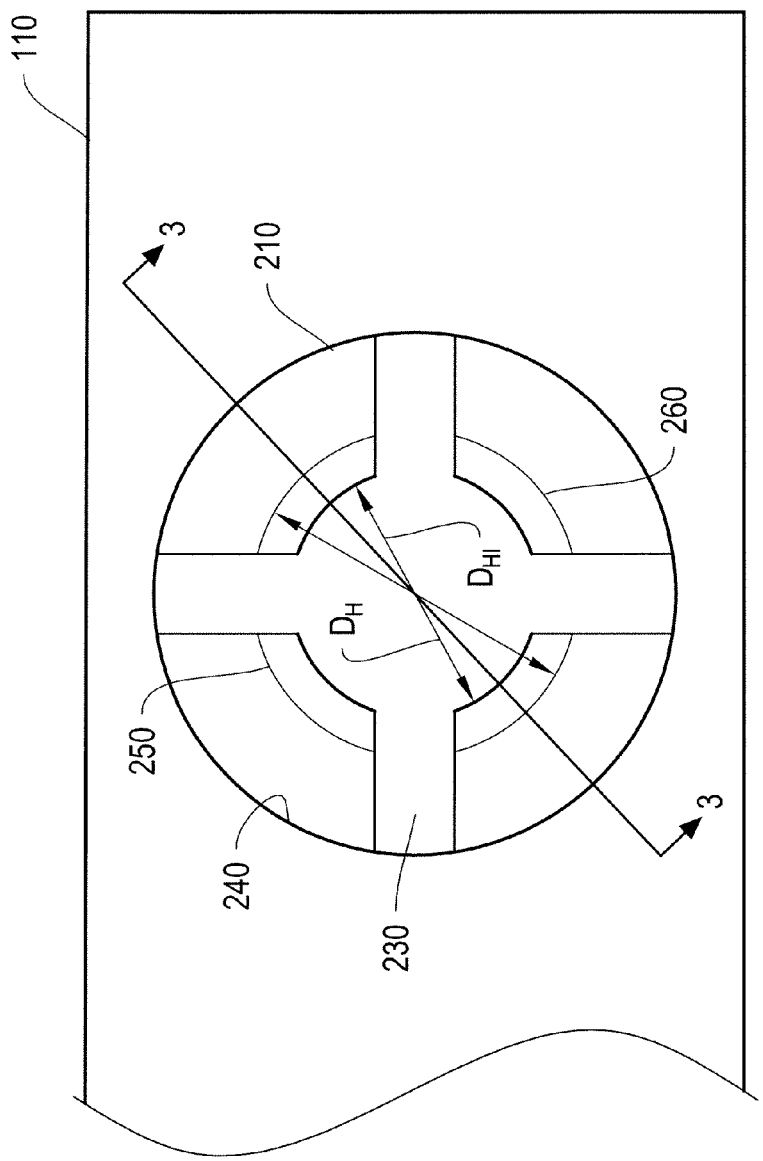
FIG. 2 is a portion of an assembly illustrating a portion of the assembly of FIG. 1.
Figure 3:
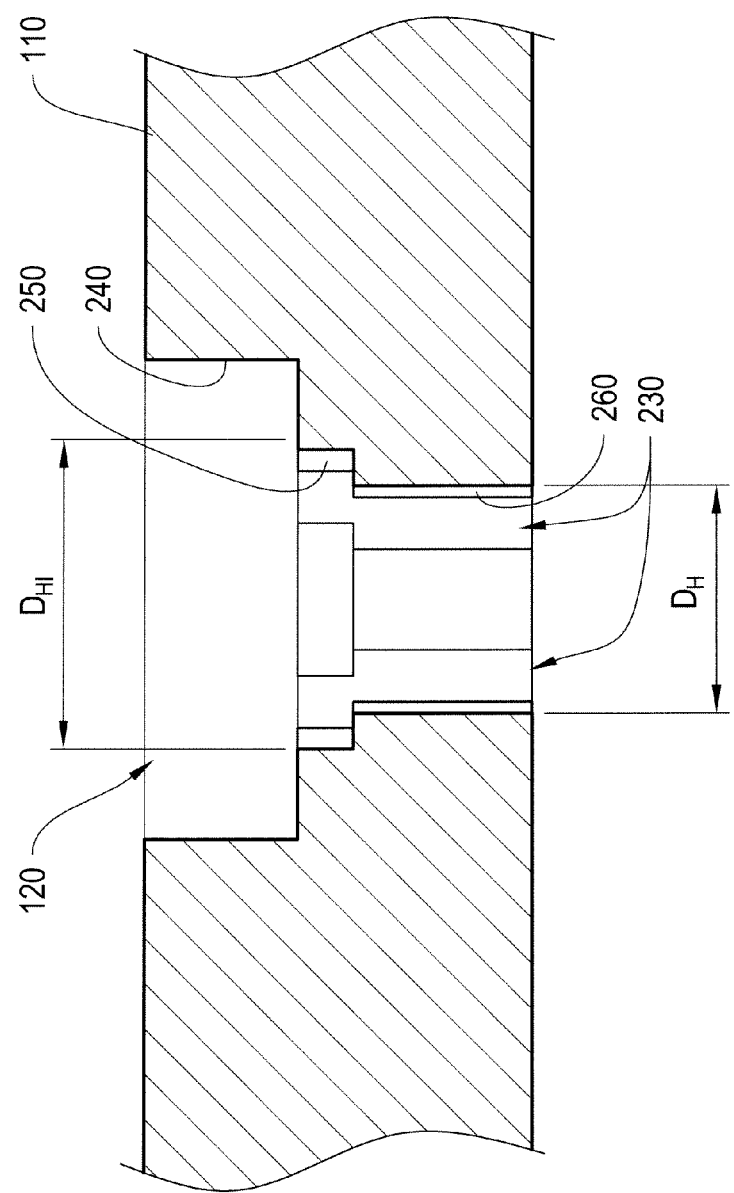
FIG. 3 is cross sectional view of the faceplate of FIG. 2.
Figure 4:
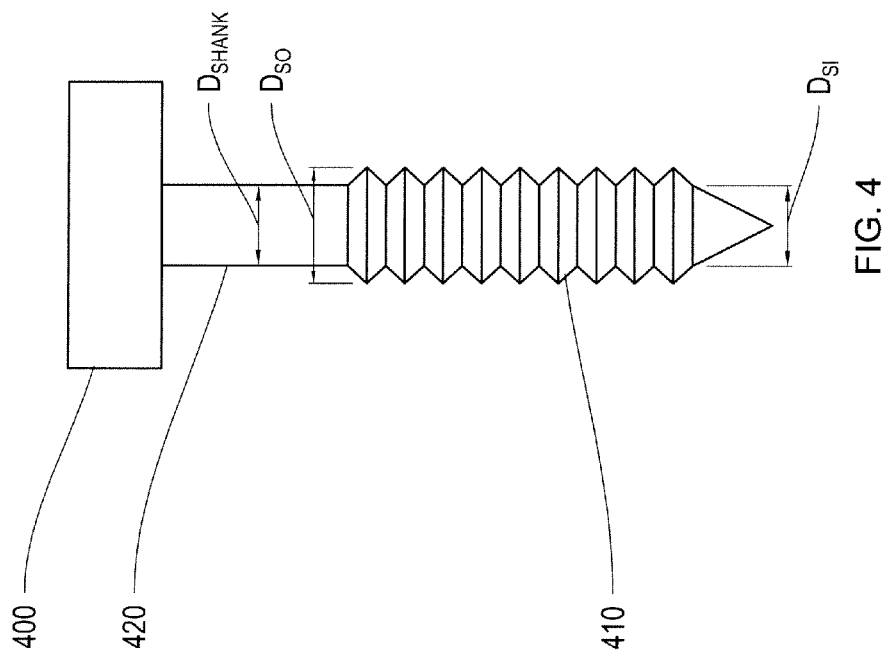
FIG. 4 illustrates a screw having a threaded portion and a shank portion.

FIGS. 1 and 3 illustrate the faceplate 110 comprising retaining elements 120, depicted here as simple holes, that pass through the faceplate 110. The retaining elements 120 are generally configured to receive screws, such as, for example, plain screws, captive screws, and tapered screws, among others. According to one embodiment of the invention, the screw is a simple captive screw 400 as illustrated in FIG. 4. The screw 400 has screw threads 410 having an inner diameter $D_{SI}$ and an outer diameter $D_{SO}$, and a shank portion 420 of the screw 400 has a screw shank diameter, $D_{SHANK}$. The captive screw can also include a spring (shown as element 440 in FIGS. 5 and 6) which seats on the screw head, on one end thereof, and which is also adapted to seat in a circular indentation, of diameter $D_{HI}$, formed in the captive screw retaining element (FIG. 2).

As illustrated in FIG. 2, the retaining element 120 has a hole of diameter $D_H$ which passes through the face plate. The hole is sized and configured to interface with the screw thread of the screw, such as, for example, the screw thread 410. Further, the retaining element 120 has a circular indentation of diameter $D_{HI}$ (250), which does not pass through the face plate, and an outer periphery (240). The retaining element includes one or more slots 230. In the embodiment illustrated by FIG. 2, the retaining element has four slots 230. Those skilled in the art will appreciate that the retaining element 120 may comprise different numbers of slots, and typically one or more slots. Further, the shape of these slots may vary in certain embodiments. According to certain embodiments, the retaining element 120 comprises one to eight slots, and preferably four slots.

Each slot 230 may be defined as having an inner periphery 260 (dashed line indicates imaginary boundary), and an outer periphery 240 that borders the periphery of the retaining element 120. In other embodiments, the outer periphery of the slot 230 may have an outer periphery smaller than the periphery of the retaining element 120. According to various embodiments of the invention, the sum of the length of the inner peripheries 260 of the slots 230 is less than 70% of diameter $D_{HI}$. In the embodiments illustrated in the figures, the cumulative inner periphery length of the slots 230 is between about 10% to about 60% of the diameter $D_{HI}$.

To accommodate the screw shank portion of the captive screw in a stable configuration, and to retain the screw thread portion in the required position, the hole diameter $D_H$ is, in general, larger than the screw shank diameter $D_{SH}$, but slightly smaller than the outer diameter of the screw $D_{SO}$ to permit engagement of screw thread 410 by the retaining element. In the illustrated embodiments, the diameter $D_H$ is between about 50% to about 92% of the outer diameter of the screw thread $D_{SO}$. According to various design aspects of the invention, the diameter $D_{HI}$ is larger than the outer screw thread diameter $D_{SO}$. In the illustrated embodiments, the diameter $D_{HI}$ is between about 110% to about 200% of the outer diameter of the screw thread $D_{SO}$. Further, in the embodiments illustrated with respect to FIGS. 1 to 6, the outer diameter of the screw thread $D_{SO}$ is 2.6 millimeters (mm), and the diameter $D_H$ is 2 mm. Those skilled in the art will readily be able determine other dimensions based on the particular application using the guidelines disclosed herein with respect to the above embodiments.

Figure 5:
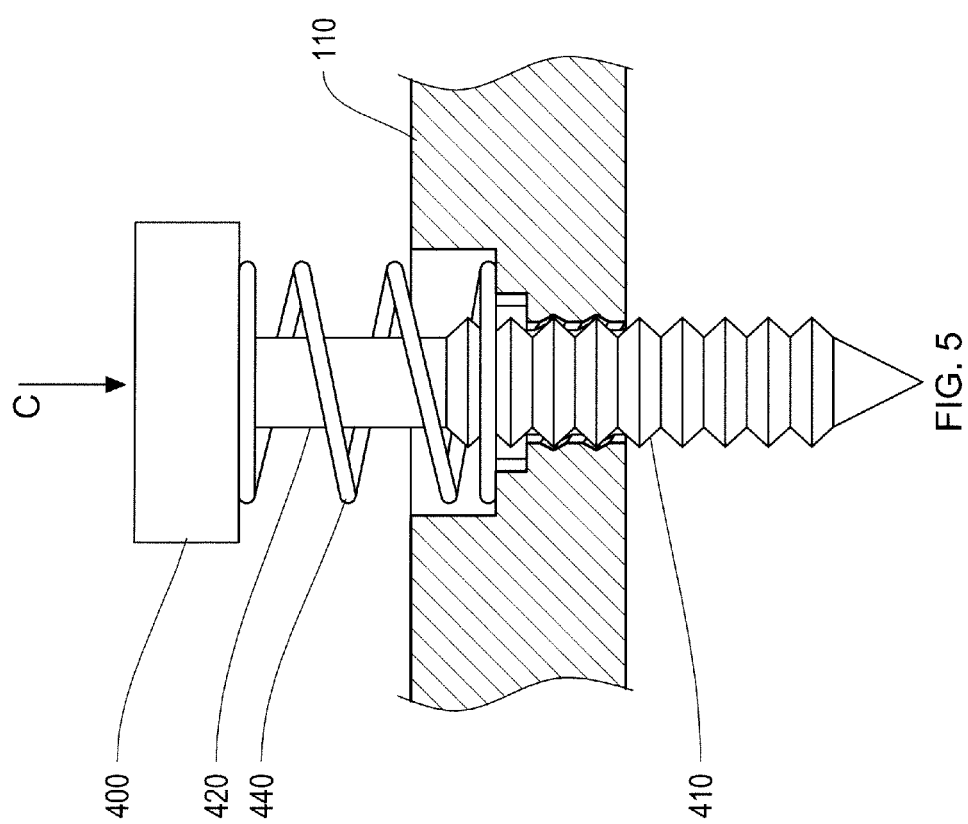
FIG. 5 illustrates the partial insertion of a screw into an assembly, according to certain aspects of the present invention.
Figure 6:
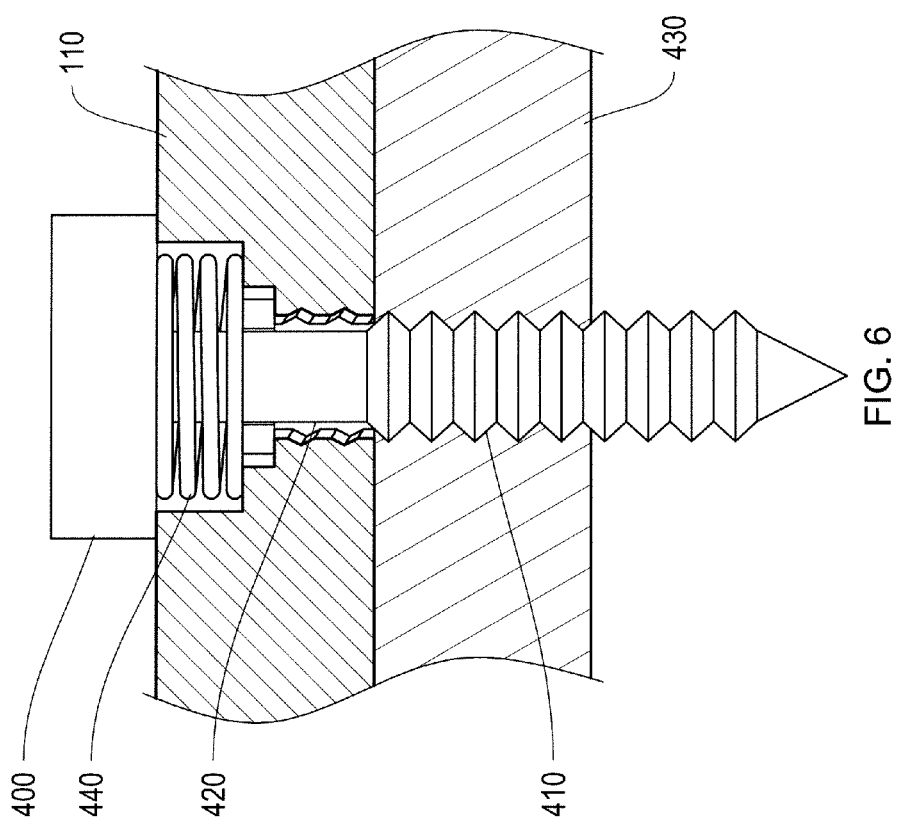
FIG. 6 illustrates a configuration of a screw inserted completely into an assembly, according to various aspects of the present invention.

As illustrated in FIGS. 5 and 6, in use the screw 400 is tightened into retaining element 120, and the retaining element through hole is configured to bear the load imposed by the screw threads 410. Accordingly, in response, the screw threads 410 and the through hole may undergo some deformation in response to force "C" driving the screw 400 down (FIG. 5). Those skilled in the art will appreciate that the screw threads 410 may also experience some deformation (not shown in the figures). As the screw 400 moves down in the direction of the force, the screw threads 410 emerge out of the hole to present the shank portion to the hole. As the screw shank 420 is exposed to the through hole, the screw 400 it is locked out of movement in the backward direction. It will be appreciated that the material of the faceplate 110 and the retaining element 120 should be strong enough to resist breakage upon insertion of the screw 400 through the retaining element 120. In the embodiment illustrated in FIG. 6, the screw threads 410 are fully extended out of the faceplate 110 and through a printed circuit board 430, and the shank 420 is exposed beyond the last hole thread. The screw threads 410 and the hole form a locking configuration preventing the backward movement of the screw 400. The slots 230 function to permit expansion of the upper portion of the hole, allowing the threaded portion of the screw to pass through, and contracting after the threaded portion passes through to effectively lock the shank portion of the screw in place.

The assembly 100 is advantageously a single, molded component, as opposed to a conventional multiple component assembly. The present invention further reduces the complexity of manufacture as well as the cost of manufacture, offering substantial cost savings on known applications, such as mounting printed circuit boards (PCB) to a rack in a computer system. These embodiments and techniques may be applied more advantageously to other applications as well, and all such applications are included within the scope of the claims appended hereto.

Advantageously, these assemblies are simpler to mount onto electronic component racks, such as a rack for mounting PCBs. According to one embodiment of the invention, the method of mounting a printed circuit board 430 onto the rack (rack not shown in the figures) comprises providing an assembly, such as the assembly 100, providing a captive screw, such as the captive screw 400, and tightening the screw 400 through the faceplate 110 and printed circuit board 430 to the rack, such that the screw threads 410 pass at least partially through the retaining element 120, and the screw shank portion 420 locks, creating a locking configuration with the retaining element 120.

As mentioned above, the present invention provides an assembly that is also easy to manufacture. Accordingly, in one embodiment, a method of manufacturing an assembly for mounting electronic components onto a rack is provided. The method includes providing a mold having a cavity in an inverse shape of the assembly 100, especially the faceplate 110 portion, and injecting a thermoplastic material at substantially high pressures such that the thermoplastic material conforms to the shape of the mold cavity after injection at substantially high pressures.

A thermoplastic is a material that is plastic or deformable, melts to a liquid when heated and freezes to a brittle, glassy state when cooled sufficiently. Most thermoplastics are high molecular weight polymers whose chains associate through weak van der Waals forces (polyethylene); stronger dipole-dipole interactions and hydrogen bonding (nylon); or even stacking of aromatic rings (polystyrene). Thermoplastic polymers differ from thermosetting polymers (Bakelite; vulcanized rubber) as they can, unlike thermosetting polymers, be remelted and remolded. Many thermoplastic materials are addition polymers; e.g., vinyl chain-growth polymers such as polyethylene and polypropylene. Further, these thermoplastics may be made conductive using conducting additives, such as, for example, graphite, among others.

Injection molding is a manufacturing technique for making parts from thermoplastic material in production. Molten plastic is injected at high pressures into a mold, which is the inverse of the product's shape. After a product is designed, molds are made from metal, usually either steel or aluminum, and precision-machined to form the features of the desired part. Injection molding may be used for manufacturing a variety of parts, including small components, and it is the most common method of production due to its ease of use and cost effectiveness. As such, injection molding is a well known technique in the art.

The main challenge in manufacturing using injection molding is whether the desired part function can be easily implemented using this technique. Conventional assemblies, such as metal faceplates, and spring loaded standoffs, which are used to mount PCBs onto racks, were typically not injection moldable. The present invention advantageously provides for all the features of a standoff in an injection moldable implementation, that is less complex than conventional systems, easy to manufacture, and provides substantial cost savings. On known applications, for example the mounting for a PCB to a typical computer system rack, costs can be reduced by over 15%, accompanied by further reductions in the complexity of manufacture. Those skilled in the art will appreciate that features, such as those described above, have been advantageously built into the faceplate 110. Such faceplates are advantageously manufactured using injection molding technology that offers the design freedom to include the features described herein.

While the invention may be susceptible to various modifications and alternative forms, specific embodiments have been shown by way of example in the drawings, and have been described in detail herein. However, it should be understood that the invention is not intended to be limited to the particular embodiments disclosed herein. Rather, the invention is intended to cover all modifications, equivalents, and alternatives falling within the spirit and scope of the invention as defined by the following appended claims.

What is claimed is:

1. A face plate assembly for EMI shielding of a printed circuit board and for mounting the printed circuit board onto a rack, the assembly comprising:
   a one-piece molded face plate comprising an electrically conductive thermoplastic material further comprising a thermoplastic polymer containing conductive additives, said face plate having opposed planar surfaces: an outer planar surface for receiving a captive screw, and an inner planar surface for contacting and securing a printed circuit board and mounting the printed circuit board onto a rack, and said face plate further comprising at least one integral retaining element;
   at least one captive screw for insertion in a retaining element molded into the face plate and for attachment to a rack, wherein the captive screw has a shank portion and a thread portion, the thread portion having an inner diameter $D_{SI}$ and an outer diameter $D_{SO}$, and the shank portion having a diameter $D_{SHANK}$;
   said at least one retaining element being adapted to secure the captive screw in place on the face plate, the retaining element having a circular indentation with a diameter $D_{HI}$ extending partially through the retaining element, and a hole within the circular indentation extending through the retaining element with a diameter $D_H$, the retaining element further including at least one slot extending from the outer periphery of the retaining element to hole $D_H$, wherein the retaining element slot enables the retaining element to expand to accommodate the captive screw as the thread portion passes through the hole, and to lock the shank portion of the screw in place when the thread portion of the screw has passed through the hole, and
   a printed circuit board secured to the inner surface of the face plate.

2. The assembly of claim 1, wherein diameter $D_H$ is about 50% to about 92% of diameter $D_{SO}$.

3. The assembly of claim 1, wherein diameter $D_{HI}$ is between about 110% to about 200% of diameter $D_{SO}$.

4. The assembly of claim 3, wherein diameter $D_{HI}$ is sized to provide a seat for the spring in the captive screw and spring element.

5. The assembly of claim 4 wherein the captive screw includes a spring seated in the circular indentation of the retaining element.

6. The assembly of claim 1, wherein the retaining element has a cylindrical shape.

7. The assembly of claim 1, wherein the retaining element has from about 1 to about 8 slots.

8. The assembly of claim 7, wherein the retaining element has 4 slots.

* * * * *